United States Patent
Chen et al.

(10) Patent No.: US 7,767,570 B2
(45) Date of Patent: Aug. 3, 2010

(54) DUMMY VIAS FOR DAMASCENE PROCESS

(75) Inventors: Kuei Shun Chen, Hsin-Chu (TW);
Chin-Hsiang Lin, Hsin-Chu (TW);
Vencent Chang, Hsinchu (TW);
Lawrence Lin, Zhubei (TW); Lai Chien Wen, Hsinchu (TW); Jhun Hua Chen, Chang Hua (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 159 days.

(21) Appl. No.: 11/457,032

(22) Filed: Jul. 12, 2006

(65) Prior Publication Data

US 2007/0224795 A1    Sep. 27, 2007

Related U.S. Application Data

(60) Provisional application No. 60/784,660, filed on Mar. 22, 2006.

(51) Int. Cl.
*H01L 21/00* (2006.01)

(52) U.S. Cl. .............. 438/597; 438/622; 438/637; 438/638; 438/644; 438/700; 257/E21.495; 257/E21.576; 257/E21.583; 257/E23.144; 257/E23.167

(58) Field of Classification Search ........... 438/622, 438/638, 624, 637, 687, 692; 257/774, E21.585, 257/E21.066, 304, 576, 579, 582, 583, E23.002, 257/142, 145, 152, 161, E27.088, E27.089, 257/E27.097
See application file for complete search history.

(56) References Cited

U.S. PATENT DOCUMENTS

| | | | |
|---|---|---|---|
| 4,869,999 A | 9/1989 | Fukuda et al. | |
| 4,937,619 A | 6/1990 | Fukuda et al. | |
| 5,742,376 A | 4/1998 | Makinouchi | |
| 5,825,043 A | 10/1998 | Suwa | |
| 5,885,856 A | 3/1999 | Gilbert et al. | |

(Continued)

FOREIGN PATENT DOCUMENTS

JP    2000-082663    3/2000

(Continued)

OTHER PUBLICATIONS

U.S. Patent and Trademark Office, Office Action mailed Feb. 21, 2006, U.S. Appl. No. 10/875,428.

(Continued)

*Primary Examiner*—Michael S Lebentritt
(74) *Attorney, Agent, or Firm*—Haynes and Boone, LLP

(57) ABSTRACT

A method of making an integrated circuit includes providing a low-k dielectric layer on a substrate, the low-k dielectric layer including or adjacent to a plurality of conductive features; patterning the low-k dielectric layer to form trenches; patterning the low-k dielectric layer to form conductive vias and dummy vias, wherein each of the conductive vias is aligned with at least one of the plurality of the conductive features and at least one of the trenches, and each of the dummy vias is a distance above the plurality of conductive features; filling the trenches, conductive vias, and dummy vias using one or more conductive materials; and planarizing the conductive material(s).

14 Claims, 13 Drawing Sheets

U.S. PATENT DOCUMENTS

| | | | |
|---|---|---|---|
| 5,965,940 A * | 10/1999 | Juengling | 257/752 |
| 5,965,941 A | 10/1999 | Weling et al. | |
| 6,087,733 A | 7/2000 | Maxim et al. | |
| 6,118,516 A | 9/2000 | Irie et al. | |
| 6,218,077 B1 | 4/2001 | Jin | |
| 6,278,515 B1 | 8/2001 | Knight et al. | |
| 6,281,583 B1 * | 8/2001 | Dirahoui et al. | 257/752 |
| 6,361,909 B1 | 3/2002 | Gau et al. | |
| 6,380,087 B1 | 4/2002 | Gupta et al. | |
| 6,391,677 B1 | 5/2002 | Kamatsuki | |
| 6,468,894 B1 * | 10/2002 | Yang et al. | 438/622 |
| 6,486,066 B2 | 11/2002 | Cleeves et al. | |
| 6,586,160 B2 | 7/2003 | Ho et al. | |
| 6,593,226 B2 | 7/2003 | Travis et al. | |
| 6,611,045 B2 | 8/2003 | Travis et al. | |
| 6,678,879 B1 | 1/2004 | Hawse et al. | |
| 6,683,382 B2 | 1/2004 | Cwynar et al. | |
| 6,767,826 B2 * | 7/2004 | Abe | 438/638 |
| 6,784,975 B2 | 8/2004 | Boettiger et al. | |
| 6,812,069 B2 | 11/2004 | Tseng et al. | |
| 6,831,365 B1 | 12/2004 | Yao et al. | |
| 6,867,070 B2 * | 3/2005 | Cho et al. | 438/118 |
| 6,930,394 B2 * | 8/2005 | Yuasa et al. | 257/760 |
| 6,961,915 B2 | 11/2005 | Loh et al. | |
| 6,984,895 B2 * | 1/2006 | Cho et al. | 257/781 |
| 7,067,919 B2 * | 6/2006 | Watanabe et al. | 257/758 |
| 7,087,350 B2 * | 8/2006 | Wang | 430/5 |
| 7,173,337 B2 * | 2/2007 | Watanabe et al. | 257/758 |
| 7,176,051 B2 * | 2/2007 | Chen et al. | 438/68 |
| 7,186,652 B2 * | 3/2007 | Hwu et al. | 438/692 |
| 7,339,256 B2 * | 3/2008 | Nakamura et al. | 257/659 |
| 7,459,787 B2 * | 12/2008 | Young | 257/758 |
| 7,545,045 B2 * | 6/2009 | Huang et al. | 257/774 |
| 7,547,584 B2 * | 6/2009 | Chen et al. | 438/128 |
| 2002/0104991 A1 | 8/2002 | Cleeves et al. | |
| 2002/0106837 A1 | 8/2002 | Cleeves et al. | |
| 2002/0130383 A1 | 9/2002 | Nakamura | |
| 2002/0179908 A1 | 12/2002 | Arao | |
| 2003/0136979 A1 * | 7/2003 | Cho et al. | 257/212 |
| 2005/0100831 A1 | 5/2005 | Finders et al. | |
| 2005/0121788 A1 * | 6/2005 | Watanabe et al. | 257/751 |
| 2005/0237508 A1 | 10/2005 | Eib et al. | |
| 2006/0003576 A1 * | 1/2006 | Yeh et al. | 438/638 |
| 2006/0094219 A1 * | 5/2006 | Soda | 438/597 |
| 2007/0007618 A1 * | 1/2007 | Hasunuma et al. | 257/508 |
| 2009/0045522 A1 * | 2/2009 | Harada | 257/774 |

FOREIGN PATENT DOCUMENTS

| | | |
|---|---|---|
| TW | 574740 | 2/2004 |

OTHER PUBLICATIONS

U.S. Patent and Trademark Office, Final Office Action mailed Aug. 23, 2006, U.S. Appl. No. 10/875,428.
U.S. Patent and Trademark Office, Advisory Action mailed Nov. 20, 2006, U.S. Appl. No. 10/875,428.
U.S. Patent and Trademark Office, Office Action mailed Apr. 27, 2007, U.S. Appl. No. 10/875,428.
U.S. Patent and Trademark Office, Final Office Action mailed Sep. 4, 2007, U.S. Appl. No. 10/875,428.
U.S. Patent and Trademark Office, Advisory Action mailed Oct. 16, 2007, U.S. Appl. No. 10/875,428.
U.S. Patent and Trademark Office, Office Action mailed Sep. 4, 2008, U.S. Appl. No. 11/259,589.
U.S. Patent and Trademark Office, Final Office Action mailed May 19, 2009, U.S. Appl. No. 11/259,589.
U.S. Patent and Trademark Office, Advisory Action mailed Jul. 2, 2009, U.S. Appl. No. 11/259,589.
U.S. Patent and Trademark Office, Advisory Action mailed Aug. 14, 2009, U.S. Appl. No. 11/259,589.
Taiwan Patent Office, Taiwan Office Action mailed Dec. 11, 2008, Taiwan Application No. 095130287, 5 pages.
Japanese Patent Office, Office Action mailed Oct. 6, 2009, Application No. 2006-290980, 4 pages.
Taiwan Patent Office, Taiwan Office Action mailed Dec. 22, 2009, Taiwan Application No. 096103589, 6 pages.
Tian, Ruiqi, e al., "Model-Based Dummy Feature Placement for Oxide Chemical-Mechanical Polishing Manufacturability", ACM, Inc., 2000, 4 pages.

* cited by examiner

US 7,767,570 B2

DUMMY VIAS FOR DAMASCENE PROCESS

CROSS-REFERENCE

This application claims priority to U.S. patent application Ser. No. 60/784,660 filed on Mar. 22, 2006, which is hereby incorporated by reference.

This application is related to U.S. patent application Ser. No. 10/875,428 filed on Jun. 24, 2004, which is hereby incorporated by reference. This application is also related to U.S. patent application entitled "SPECIAL ILLUMINATION FEATURE FOR HOLE PATTERNING PROCESS".

BACKGROUND

The dual damascene process is often adopted in semiconductor fabrication when feature sizes are scaled down and/or technology nodes exist in the submicron level. In the dual damascene process, copper is often used as conductive material for interconnection. Other conductive materials include tungsten, titanium, titanium nitride, and so forth. With these examples, inter-level dielectric (ILD) may include silicon oxide, fluorinated silica glass, or low dielectric constant (k) materials. Chemical mechanical polishing (CMP) processing is often implemented to etch back and globally planarize the ILD and conductive materials. CMP involves both mechanical grinding and chemical etching in the material removal process. However, because the removal rate of metal and dielectric materials are usually different, polishing (such as CMP) can lead to undesirable dishing and erosion effects. The surface level variation may approach or exceed a depth of focus for a lithography process used in further processing, which thereby degrades exposure and patterning resolution.

It is desired to reduce surface level variation due to processes like CMP, and improve exposure and patterning resolution for processes such as lithography.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

DETAILED DESCRIPTION

Figure 1A:
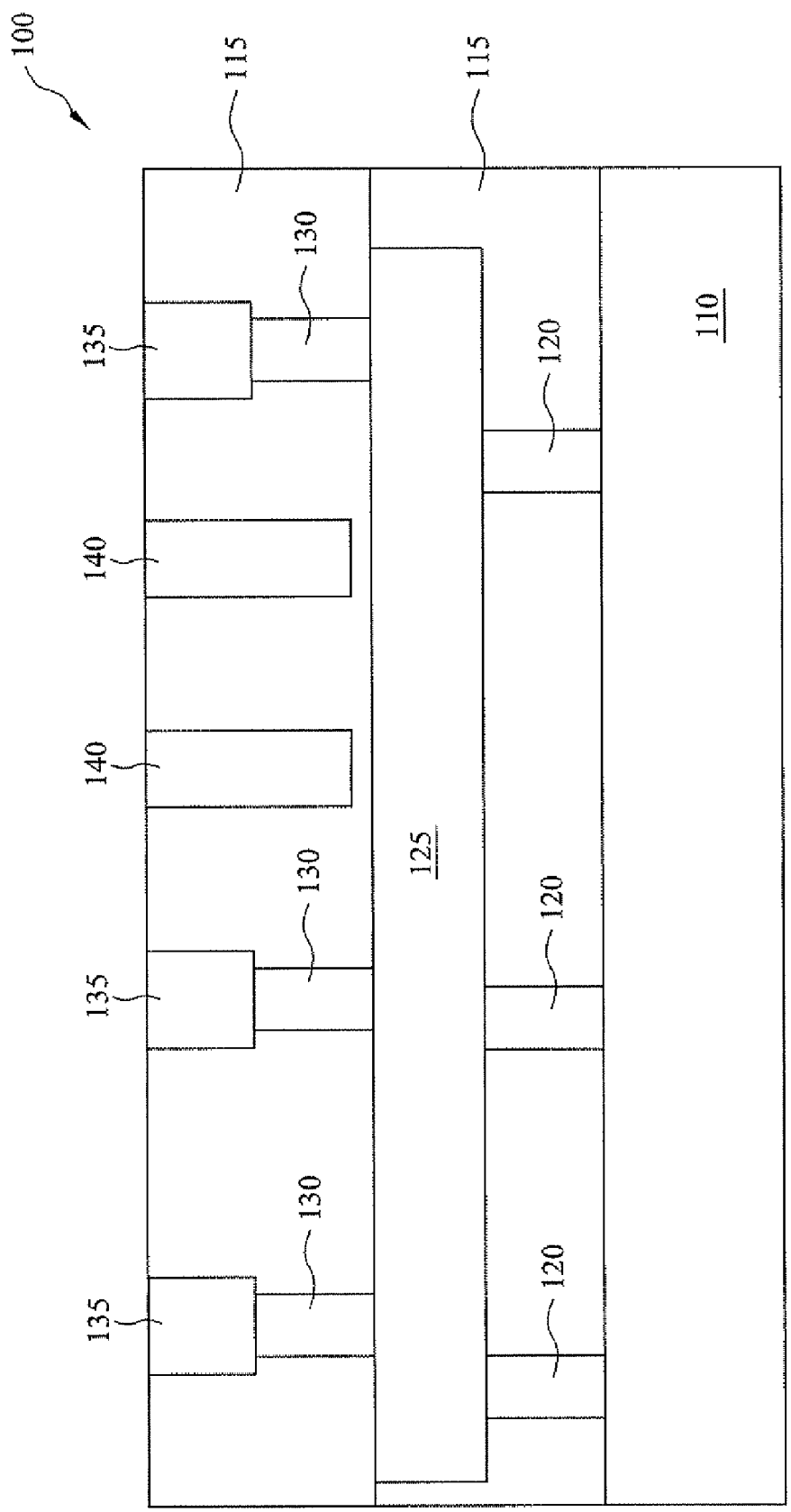
FIG. 1a is a cross-sectional view of one example of dummy vias fabricated in a semiconductor device.

It is to be understood that the following disclosure provides many different embodiments, or examples, for implementing different features of various embodiments. Specific examples of components and arrangements are described simplistically for purposes of clarity. These are, of course, merely examples and are not intended to be limiting. In addition, the present disclosure may repeat reference numerals and/or letters in the various examples. This repetition is for the purpose of simplicity and clarity and does not in itself dictate a relationship between the various embodiments and/or configurations discussed. Moreover, the formation of a first feature over or on a second feature in the description that follows may include embodiments in which the first and second features are formed in direct contact, and may also include embodiments in which additional features may be formed interposing the first and second features, such that the first and second features may not be in direct contact.

Figure 1B:
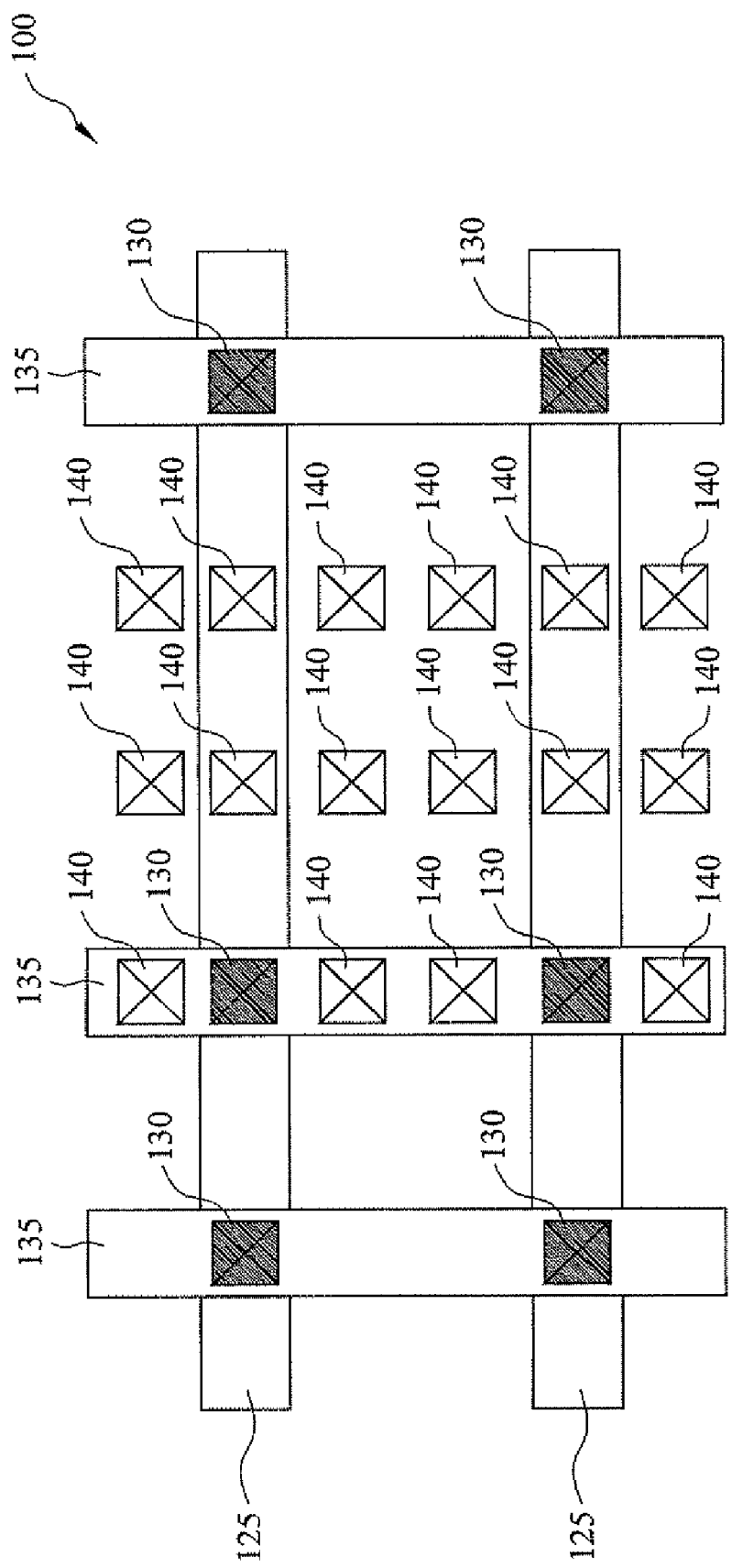
FIG. 1b is a top view of another example of dummy vias fabricated in a semiconductor device.

Referring to FIGS. 1a and 1b, a semiconductor device 100 includes a substrate 110. The substrate 110 may include an elementary semiconductor such as silicon, germanium, and diamond. The substrate 110 may comprise a compound semiconductor such as silicon carbide, gallium arsenic, indium arsenide, and indium phosphide. The substrate 110 may comprise an alloy semiconductor such as silicon germanium, silicon germanium carbide, gallium arsenic phosphide, and gallium indium phosphide. The substrate 110 may include an epitaxial layer, doped regions, and/or isolation features. Furthermore, the substrate 110 may comprise a semiconductor-on-insulator (SOI) structure.

The device 100 may further comprise a dielectric layer 115. The dielectric layer 115 may include silicon oxide, FSG, low-k materials, or combination thereof. The low-k material can be defined as a dielectric material having its dielectric constant less than 3.9, that of a thermal silicon oxide. The low-k materials may comprises carbon doped silicon oxide, Black Diamond® (Applied Materials of Santa Clara, Calif.), Xerogel, Aerogel, amorphous fluorinated carbon, Parylene, BCB (bis-benzocyclobutenes), SiLK (Dow Chemical, Midland, Mich.), polyimide, and/or other materials.

The device 100 may further comprise a plurality of conductive features 120 functioning as contacts to electrically connecting the underlying active regions (such as sources, drains, and gates) and overlying conductive lines. The conductive features 120 may include copper in one embodiment. The conductive features 120 may alternatively include tungsten, copper, titanium, titanium nitride, or combinations thereof.

The device 100 may further comprise first conductive lines 125 and second conductive lines 135, wherein the first and second conductive lines 125 and 135 are vertically disposed at different layers. Conductive vias 130 are disposed and formed between and electrically connected to the first and second conductive lines 125 and 135. Dummy vias 140 are also disposed and formed between the first and second conductive lines 125 and 135. Although the dummy vias 140 may be formed of electrically conductive material, they may not be electrically connected to any functional circuits or may not be used to interconnect circuits. Furthermore, top surfaces of the dummy vias 140 and the second conductive lines 135 are substantially coplanar, which may be utilized by a method disclosed in the present disclosure. For the sake of reference, dummy vias 140 will not be further described as being "conductive" to differentiate them from the conductive vias 130, despite the fact that the dummy vias can be conductive.

The device 100 may further comprise at least one etch stop layer. For example, an etch stop layer may be disposed at an interface between the substrate 110 and the dielectric layer 115. In addition or in the alternative, an etch stop layer may be disposed at an interface between the first conductive lines 125 and the conductive vias 130 and be patterned to have openings such that the conductive vias 130 may have direct contact with the first conductive lines 125. The etch stop layer may comprise a material selected from the group consisting of silicon nitride, silicon oxynitride, silicon carbide, and other proper materials.

Figure 2:
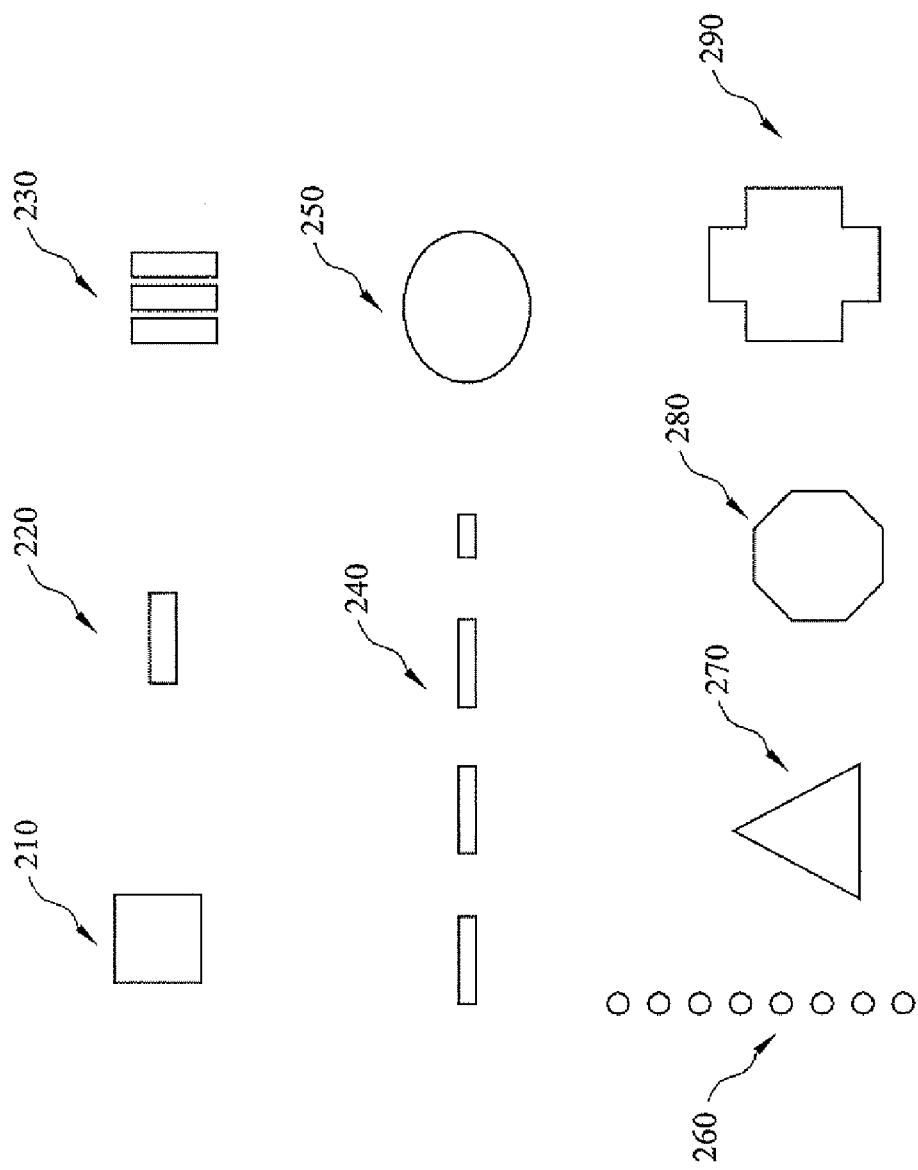
FIG. 2 is a schematic view of various embodiments of dummy vias utilized in semiconductor devices.

Referring to FIG. 2, the dummy vias 140 may be designed in various shapes. The dummy via may include, for example, a square 210, a rectangular 220, a rectangle array 230, a broken stripe 240, a dotted stripe 250, a circle 260, a triangle 270, polygon 280, and a cross 290. The above list only provides a few exemplary embodiments. Other suitable shapes may also be considered as proper dummy vias for the same purpose. These dummy vias may have different sizes and/or depths, may be placed randomly in location and/or orientation, and may be combined in various ways to reduce the leveling residual effect. In one embodiment, a dummy via may have a dimension not less than 80% of that of the conductive vias 130.

Generally, the dummy vias 140 may be similar to the conductive vias 130, conductive lines 125 and 135 in composition and formation. The dummy vias may be constructed of metal or other conductive materials used in multilayer interconnection. The conductive material may include copper, copper alloy, tungsten, titanium, titanium nitride, or combinations thereof. The dummy vias may have a multilayer structure. For example, the dummy vias may comprise a barrier/adhesion layer, a copper seed layer, and a bulk copper layer.

The dummy vias may be used to adjust local pattern density for better polishing effect and eliminate the leveling residual effect. Often, chemical mechanical polishing (CMP) may have different removal rates to different materials and is pattern-dependent. For example, a CMP process may have dishing and/or erosion effects on an interconnect pattern comprising dielectric materials and metal materials. Dishing occurs when the copper recedes below or protrudes above the level of the adjacent dielectric. Erosion is a localized thinning of the dielectric. With properly designed and configured dummy vias, the top surfaces of the dummy vias 140 and the second conductive lines 135 are substantially coplanar after CMP processing. The leveling effect may be substantially reduced or minimized.

Figure 3A:
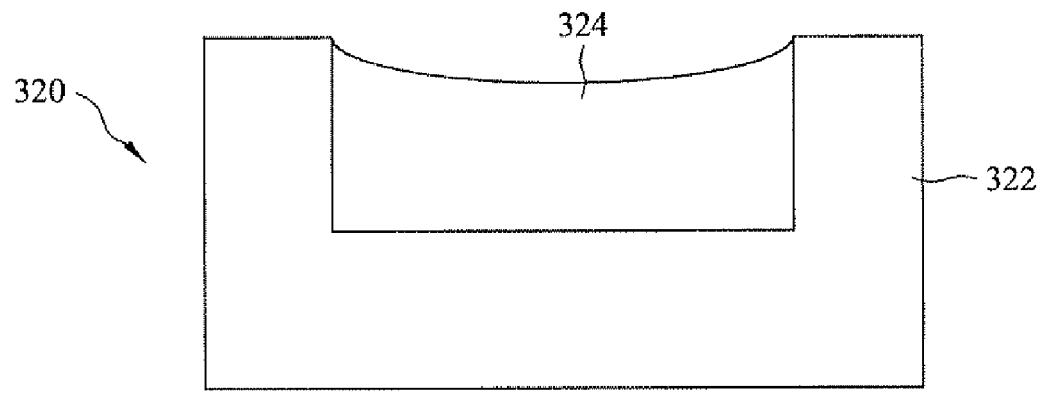
FIGS. 3a-3d are cross-sectional views of dishing and erosion in a semiconductor wafer, caused by chemical mechanical polishing processing (CMP).

Referring to FIG. 3a, a semiconductor device 320 exhibits dishing when metal 324 has a higher removal rate than that of dielectric material 322. The dielectric material 322 may include silicon oxide, fluorinated silica glass (FSG), low-k materials, or combinations thereof. The metal 324 may include copper, tungsten, titanium, titanium nitride, tantalum, tantalum nitride, or combinations thereof. The dielectric 322 and the metal 324 may be part of interconnection structure in an integrated semiconductor circuit and may be fabricated by dual damascene processing including multiple processes such as deposition, etching, and CMP. When removal rate of the metal feature 324 is higher than that of the dielectric feature 322 in a polishing process such as CMP, a substantial deviation of surface profile from a flat one is referred to as dishing.

Figure 3B:
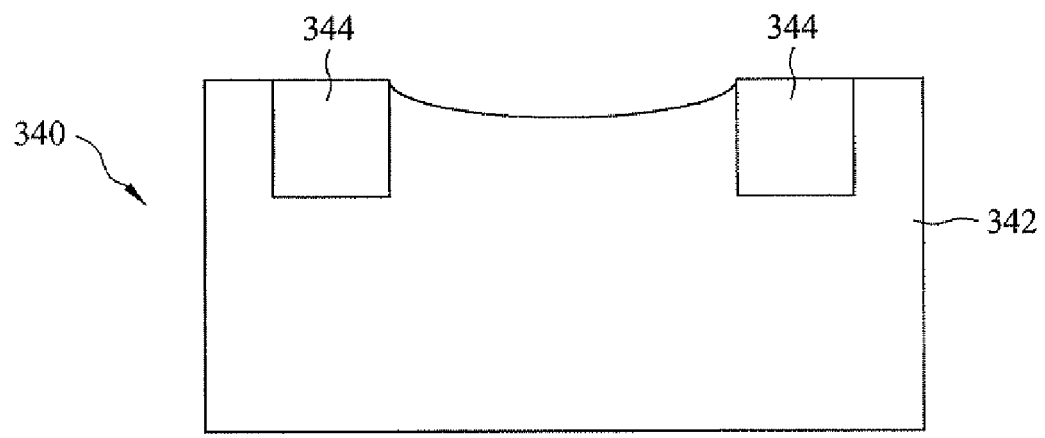

In FIG. 3b, a semiconductor device 340 exhibits dishing when dielectric material 342 has a higher removal rate than that of metal 344. When the removal rate of the dielectric 342 is higher than that of the metal 344, the surface profile has a substantial deviation from a flat one.

Figure 3C:
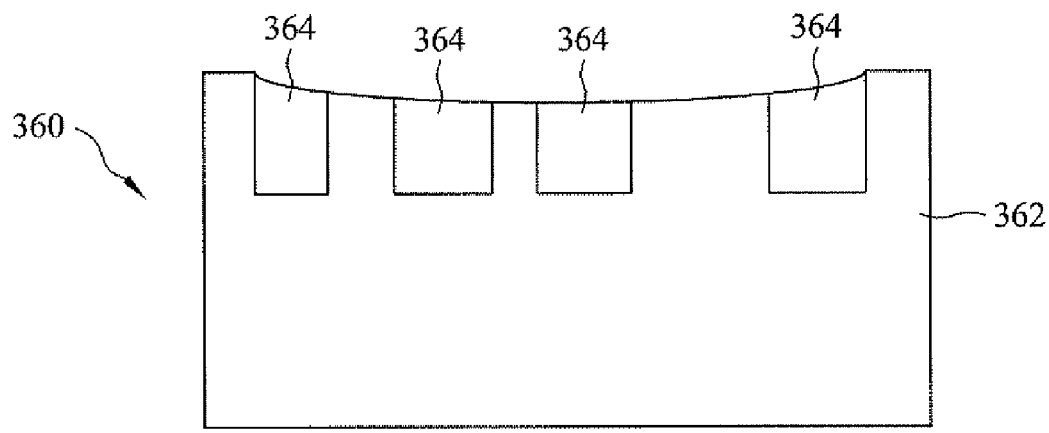

In FIG. 3c, a semiconductor device 360 exhibits erosion when a dielectric material 362 has a higher removal rate than that of metal 364. When the removal rate of the dielectric 362 is higher than that of the metal 364, a substantial deviation of surface profile from a flat one is referred to as erosion.

Figure 3D:
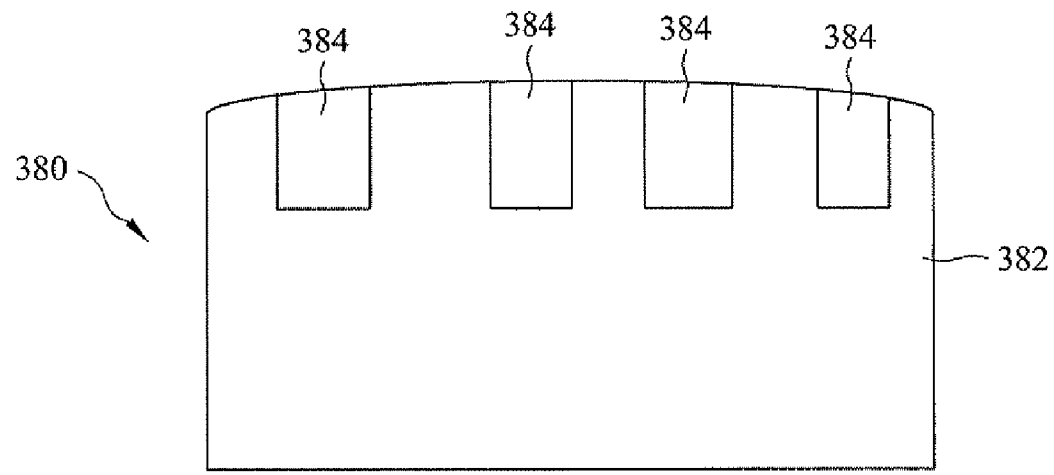

In FIG. 3d, a semiconductor device 380 exhibits erosion when a dielectric material 382 has a higher removal rate than that of metal 384. When the removal rate of the metal 384 is higher than that of the dielectric 382, the surface profile has a substantial deviation from a flat one.

Dishing and erosion are sensitive to pattern structure and pattern density. Dummy vias are designed and incorporated into a damascene structure to make pattern density more uniform to improve the planarization process and eliminate the leveling residual effect such that the surface level variation can be reduced and minimized within depth of focus (DOF). An irregular dummy vias may be adopted. A candidate dummy via may include any dummy via illustrated in FIG. 2 but is not so limited thereto. In one embodiment, the size and thickness of a chosen dummy feature may be randomly generated. Furthermore, the dummy feature may be inserted in a location and an orientation which can also be randomly generated, or randomly determined under certain conditions. Irregular dummy vias and random insertion may eliminate pattern spatial signature.

The dummy vias are not limited to existing between the metal one and metal two layers. The dummy vias may be disposed between other neighbor metal layers such as between metal two and metal three layers. The dummy vias can also be extended to include dummy contacts between metal one layer and the substrate.

Figure 4:
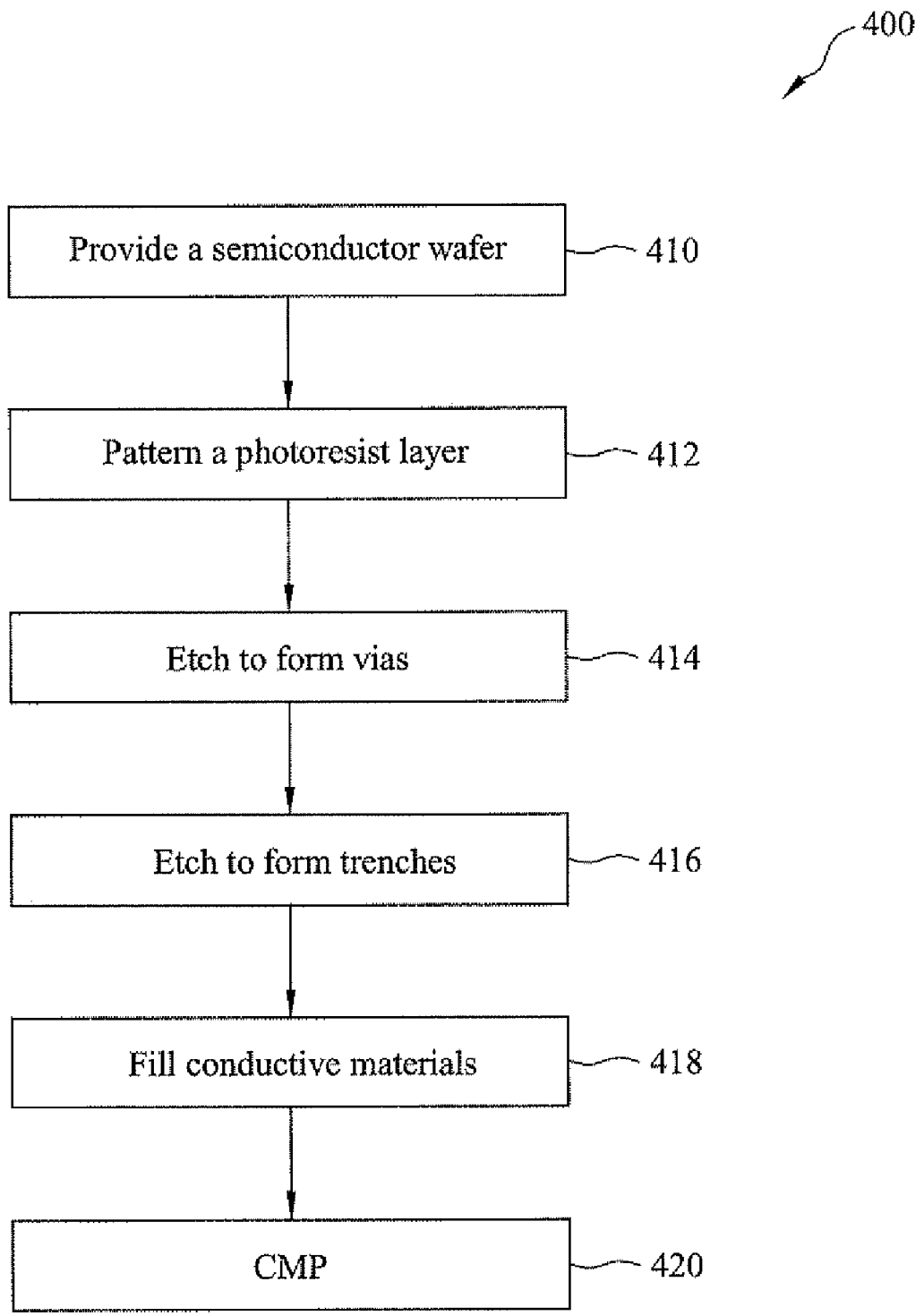
FIG. 4 is a flow chart of one embodiment of a method to fabricate a semiconductor device having at least one dummy via.

Referring to FIG. 4, a method 400 can be used to fabricate a semiconductor device having at least one dummy via. With additional reference to FIGS. 5 through FIG. 11 as sectional views of several embodiments of a semiconductor device 500 during various fabrication stages, the method 400 is described below. The method 400 may be compliant to a normal damascene process and may have various embodiments. For example, FIGS. 5, 6a, 7a, 8a, and 9-11 illustrate a via-first damascene method while FIGS. 5, 6b, 7b (or 7c), 8b, and 9-11 illustrate a trench-first damascene method.

Figure 5:
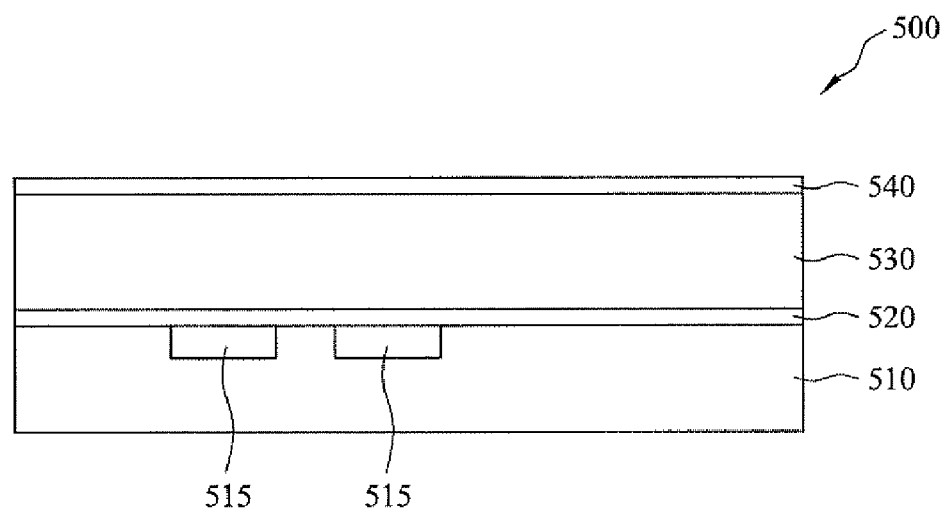
FIGS. 5 through 11 are cross-sectional views of a semiconductor device having dummy vias during various fabrication stages.

Referring to FIGS. 4 and 5, the method 400 begins at step 410 by providing the semiconductor device 500. The semiconductor device 500 comprises a substrate 510, which may be similar to the semiconductor substrate 110 of the FIG. 1 and may further comprise a portion of the interconnect structure such as first several metal layers. Exemplary conductive lines (features) 515 are disposed therein and simplistically illustrated for clarity. The semiconductor device 500 comprises a low-k dielectric layer 530 over the substrate, which may be substantially similar to the low-k dielectric layer 115 of FIGS. 1a and 1b. The semiconductor device 500 further comprises an etch stop layer 520 disposed between the substrate 510 and the low-k dielectric layer 530 and a dielectric layer 540 overlying the low-k dielectric layer 530. The dielectric layer 540 may be a hard mask layer, an anti-reflective coating (ARC) layer, or a hard mask layer tuned to have anti-reflective function. The etch stop layer 520 and/or the dielectric layer 540 may be formed by chemical vapor deposition (CVD), physical vapor deposition (PVD), or other suitable techniques. The etch stop layer 520 and/or the dielectric layer 540 each may comprise silicon nitride, silicon oxynitride, silicon carbide, and/or other proper materials. The dielectric layer 540 may be adjusted in composition and formation such that an optical reflective index or absorption coefficient is tuned to reduce optical reflection during lithography process. The dielectric layer 540 may use other materials such as polymer materials. The dielectric layer 540 may further include other functions such as diffusion barrier and/or adhesion.

Figure 6A:
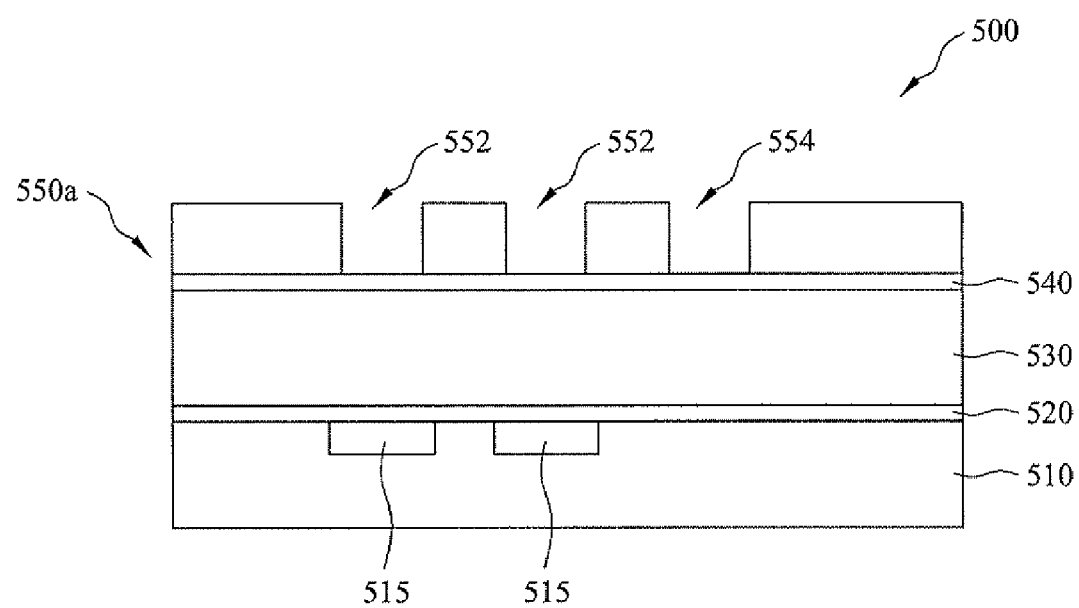
Figure 6B:
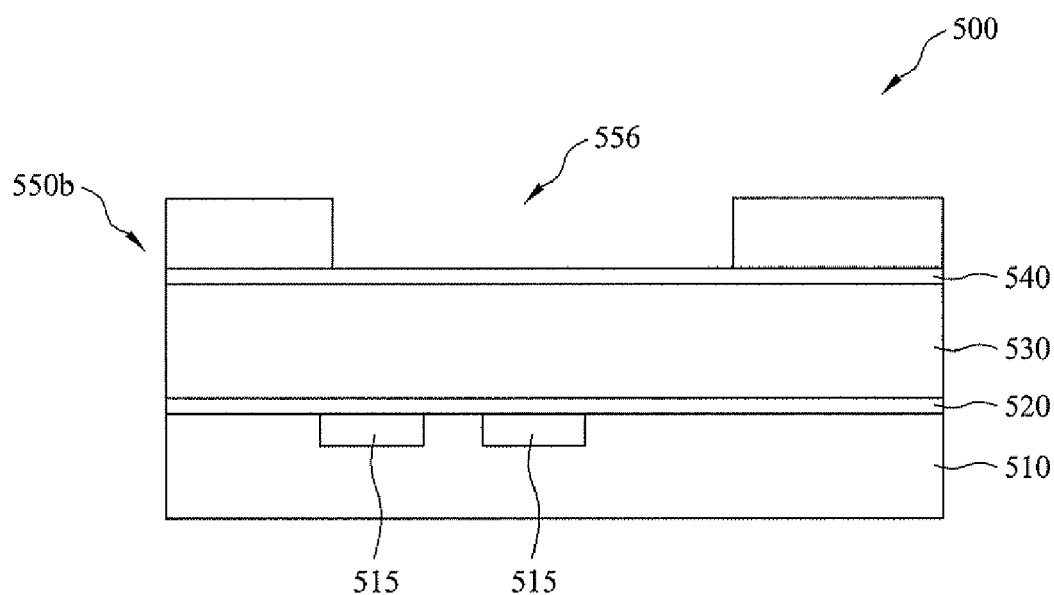

Referring to FIGS. 4 and 6a/6b, the method 400 proceeds to step 412 for implementing a photolithography process. At step 412, a photoresist (resist) layer 550 is coated on the semiconductor device 500 by a method such as spin-on coating. Then the resist layer 550 is patterned to form a plurality of openings such as conductive via pattern 552, dummy via pattern 554, and trench pattern 556, such as by using a photomask (mask or reticle). An exemplary photolithography patterning process may also include soft baking, mask aligning, exposing pattern, post-exposure baking, resist developing, and hard baking. The photolithography patterning may also be implemented or replaced by other proper methods such as maskless photolithography, electron-beam writing, ion-beam writing, and molecular imprint. As an example, FIG. 6a illustrates a patterned resist layer 550a used in the via-first method wherein the openings 552 and 554 thereof are vertically aligned to underlying conductive vias and dummy vias to be formed. As an alternative example, FIG. 6b illustrates a patterned resist layer 550b used in the trench-first method wherein the openings 556 thereof are vertically aligned to underlying trenches to be formed.

The method 400 proceeds to step 414 by etching the dielectric layer and the low-k dielectric layer to form conductive vias and dummy vias, and step 416 by etching the dielectric layer and the low-k dielectric layer to form trenches. Steps 414 and 416 can be in different process sequences such as step 414 to step 416 in the via-first method or step 416 to step 414 in the trench-first method.

Figure 7A:
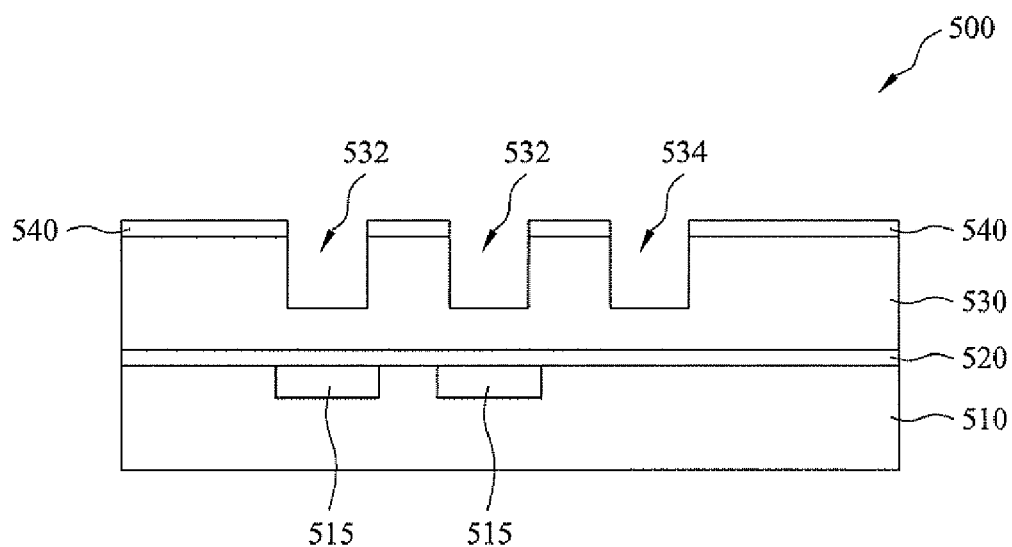
Figure 8A:
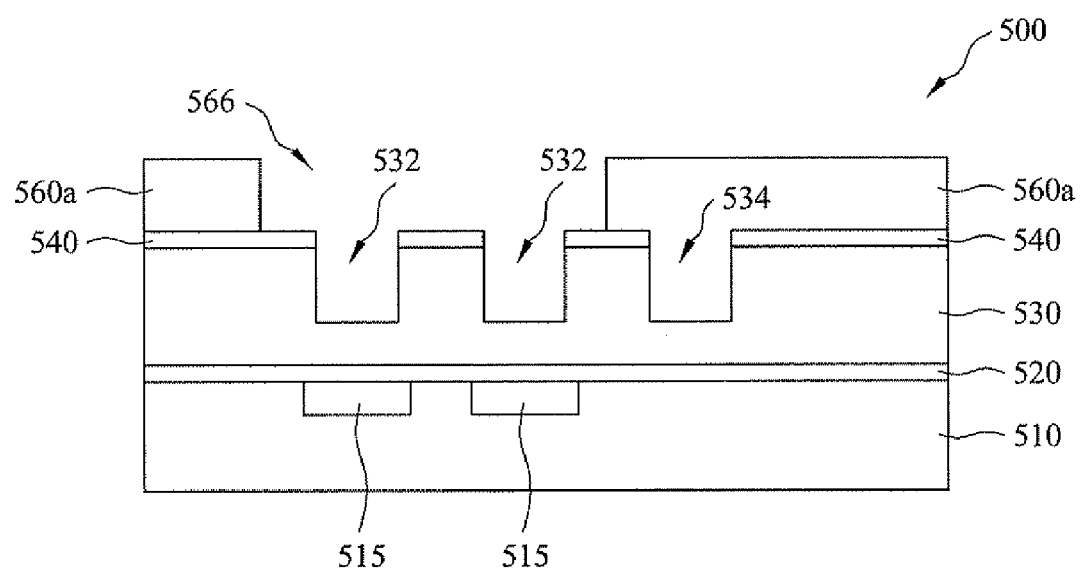
Figure 9:
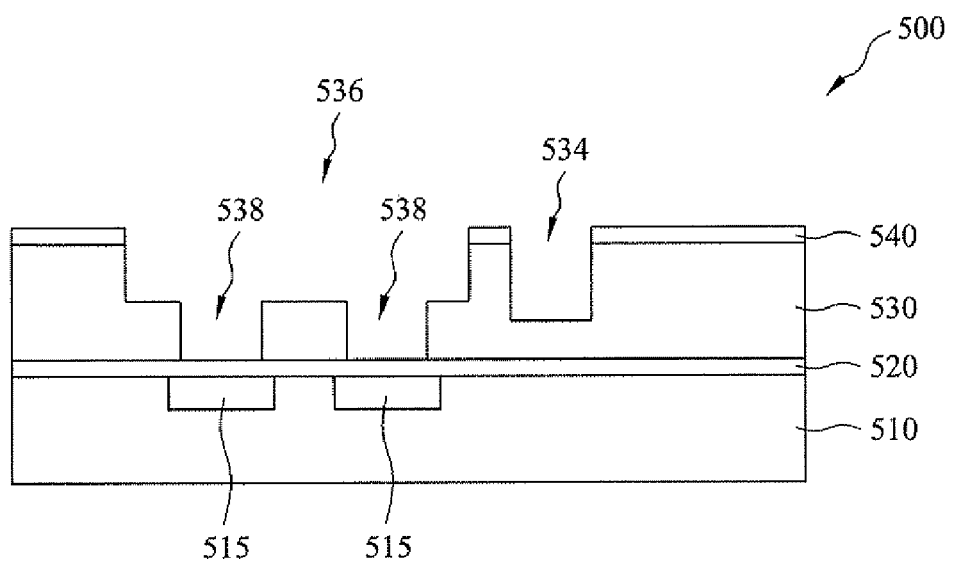

Referring to FIGS. 7a, 8a, and 9, at first, conductive vias are partially etched and dummy vias are etched. Then trenches are etched while the conductive vias are further etched to expose the underlying conductive lines 515. The dielectric layer 540 is etched to transfer the conductive via openings 552 and the dummy via openings 554 from the via resist pattern 550a (FIG. 6a) to the dielectric layer 540. The low-k dielectric layer 530 may be partially etched to transfer the conductive via openings 552 and the dummy via openings 554 to the low-k dielectric layer as illustrated in FIG. 7a. The etching of the dielectric layer 540 and the low-k layer 530 results in conductive via openings 532 and dummy openings 534 formed therein. The etching of the dielectric layer and the etching of the low-k dielectric layer may be performed in one etching process, two separate etching processes wherein the low-k etching is after the resist stripping, or two sequential sub-steps of one etching process each having a different recipe including different etchants. In one example, the dielectric layer 540 may be patterned, the resist layer 550a is then stripped, and the patterned dielectric layer is used as a hard mask layer to partially etch the low-k dielectric layer. The low-k dielectric layer may be partially etched to about 50% of the original thickness.

Referring to FIG. 8a, another resist layer 560a is coated and patterned to form trench openings 566 using a photolithography process similar to the photolithography process described in step 412. The dielectric layer 540 and low-k dielectric layer 530 are etched such that the low-k dielectric layer 530 in the conductive via openings 532 is completely removed to expose underlying conductive lines 515, while the dielectric layer 540 is removed and the low-k dielectric layer 530 within the trench regions 560 (but out of the conductive via regions 532) is partially removed to form trenches. The dummy via regions 534 can be protected from the further removal by the resist layer 560a. The etch stop layer 520 in the via regions is removed by a same or different etching process or different etching recipes in a same etching tool. The resist layer 560a may be removed thereafter by a wet stripping or a dry ashing. Trenches 536, conductive vias 538, and dummy vias 534 are formed as illustrated in FIG. 9.

Figure 7B:
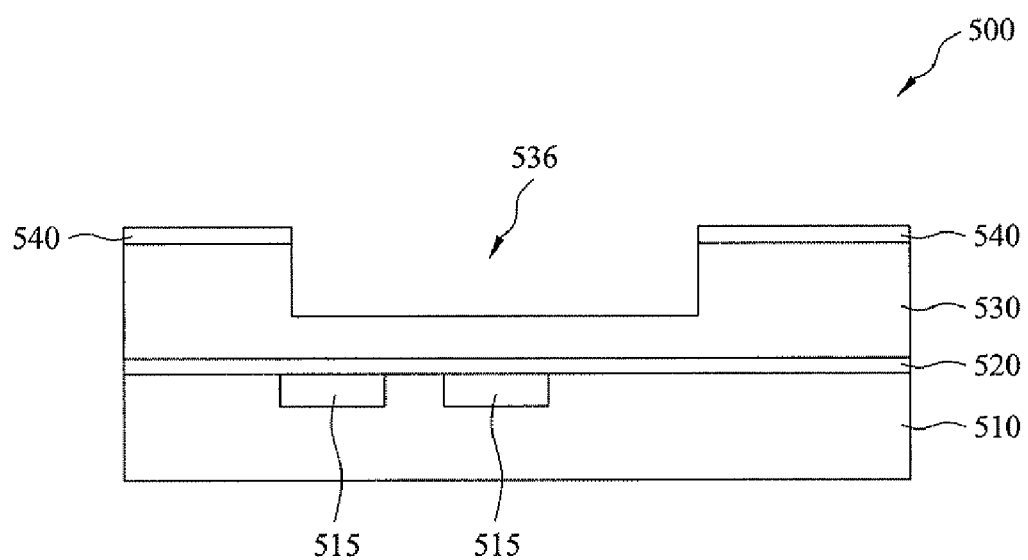
Figure 8B:
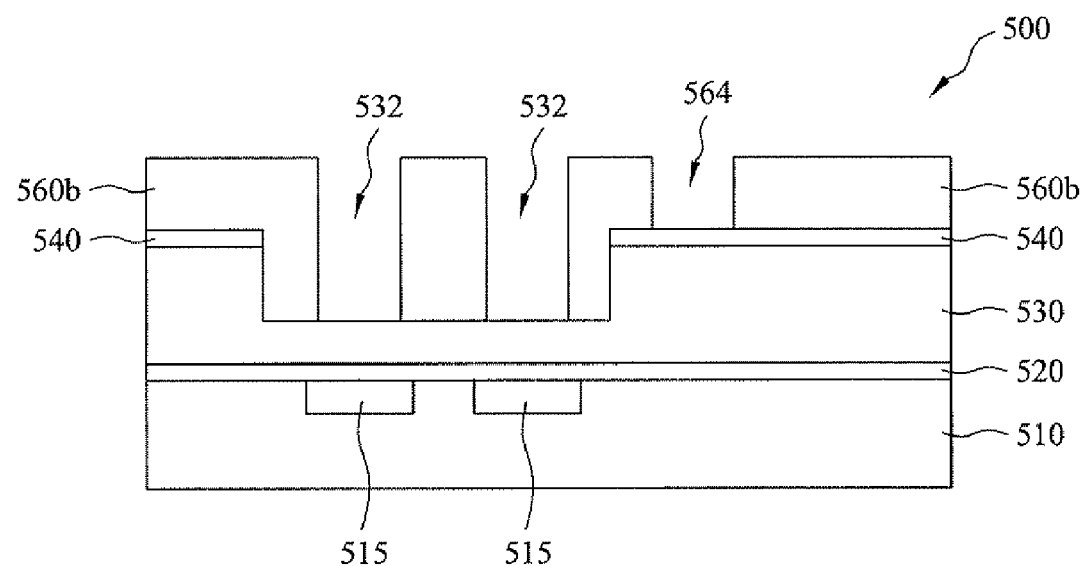

In another embodiment with reference to FIGS. 7b, 8b, and 9, trenches are first etched and then conductive vias and dummy vias are etched. For example, the dielectric layer 540 is etched to transfer the trench openings from the trench resist openings 550b (FIG. 6b) to the dielectric layer 540. The low-k dielectric layer 530 may then be partially etched to form trench openings 536 in the low-k dielectric layer 530, as illustrated in FIG. 7b. The etching of the dielectric layer 540 and the etching of the low-k dielectric layer 530 may be performed in one etching process, two separate etching processes, or two sequential sub-steps of one etching process each having a different recipe. In one example, the dielectric layer 540 is etched, the resist layer 550b is then stripped, and the patterned dielectric layer 540 is used as a hard mask to partially etch the low-k dielectric layer 530. The low-k dielectric layer may be partially etched to about 50% of the original thickness. Referring to FIG. 8b, another resist layer 560b is coated and patterned to form a via pattern using a photolithography process similar to the photolithography described in step 412. The dielectric layer 540 and low-k dielectric layer 530 are etched such that the low-k dielectric layer in the conductive via regions is completely removed to form vias 532, while the dielectric layer 540 is removed and the low-k dielectric layer 530 in the dummy via regions 564 is partially removed to form dummy vias. The etch stop layer 520 in the via regions is removed by a same or different etching process or different etching recipes in a same etching tool. The resist layer 560b may be removed thereafter by a wet stripping or a dry ashing. Trenches 536, vias 538, and dummy vias 534 are formed as illustrated in FIG. 9.

Figure 7C:
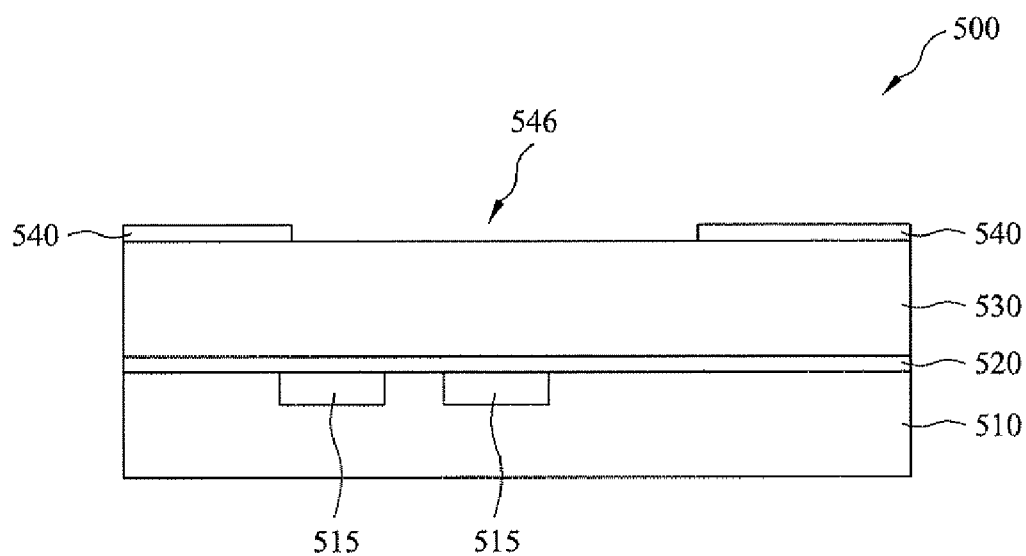
Figure 8C:
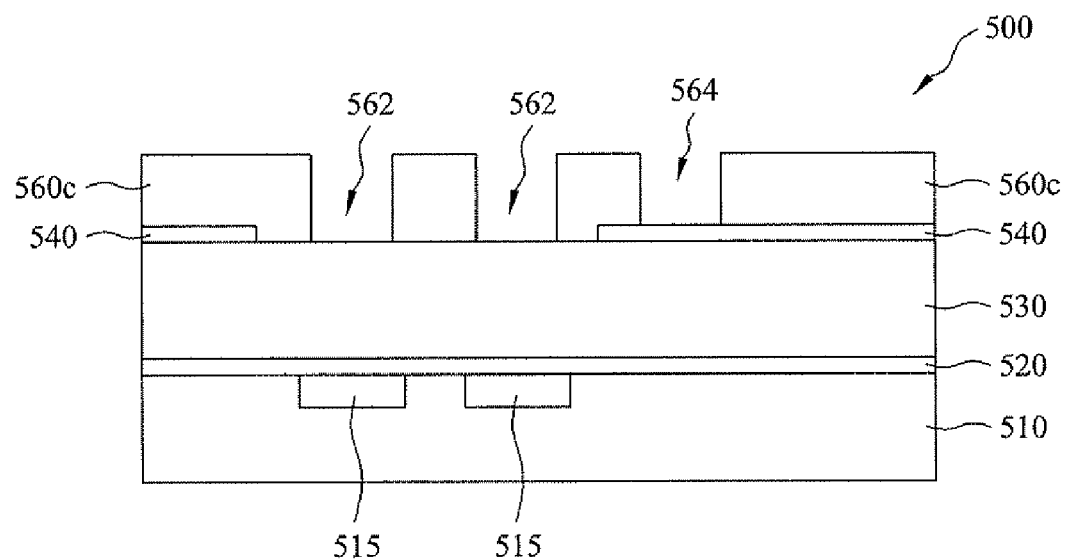

In another embodiment with reference to FIGS. 7c, 8c, and 9, the dielectric layer 540 is etched to transfer the trench openings from the trench resist pattern 550b (FIG. 6b) to the dielectric layer 540. The resist layer 550b is then stripped, resulting in a patterned dielectric layer 540 having trench openings 546 as illustrated in FIG. 7c. Referring to FIG. 8c, another resist layer 560c is coated and patterned to form a resist pattern comprising via openings 562 and dummy via openings 564 using a photolithography process similar to the photolithography process described in step 412. The low-k dielectric layer 530 in the trench regions is partially etched. The dielectric layer 540 in the dummy via regions may be removed in another etching process. The resist layer 560c is stripped thereafter. The low-k dielectric layer 530 in the trench regions and dummy via regions are then etched in another etching process such that the low-k dielectric layer in the via regions are completely removed to expose the conductive lines 515 and the low-k dielectric layer in the dummy via regions and rest of the trench regions are simultaneously and partially removed, resulting in the formation of the trenches 536, vias 538, and dummy vias 534, as shown in FIG. 9. Each of the dummy vias 534 has a bottom surface distance above the conductive lines 515.

The present disclosure can be extended to other alternative methods without departure of the spirit of the invention. For example, the semiconductor device 500 may include a second etch stop layer embedded in the low-k dielectric layer implemented by several processing steps, including depositing low-k material, depositing the second etch stop layer, patterning the second etch stop layer to define the openings of the vias, and depositing low-k dielectric material on the second etch stop layer. The process of forming trenches, vias, and dummy vias can then be implemented in another lithography process. An etching process, including depositing a dielectric layer, resist coating, resist patterning to form trench openings and dummy via openings, etching the dielectric layer, resist stripping, and etching the low-k dielectric layer until the etching goes beyond the via openings of the second etch stop layer and reaches the first etch stop layer in the via regions while the low-k dielectric layer in the trenches and dummy vias regions are partially removed and stopped by the second etch stop layer, can be used in the formation of the trenches 556, conductive vias 532, and dummy vias 534 as shown in FIG. 9.

Figure 10:
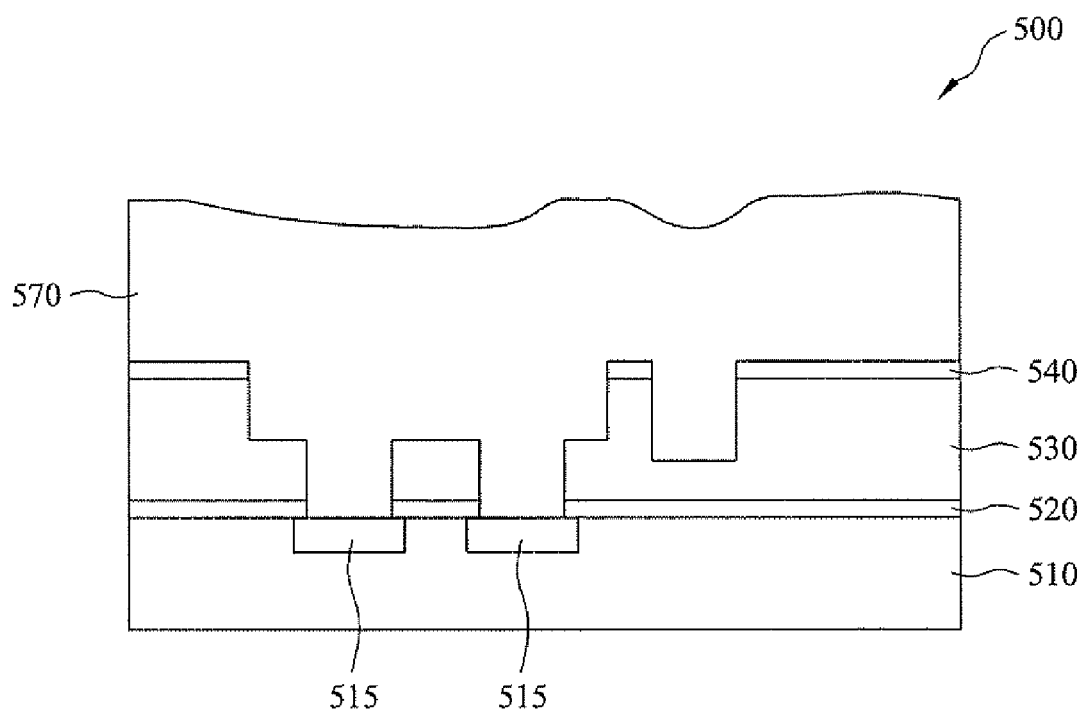

Referring to FIGS. 4 and 10, the method 400 proceeds to step 418 by filling conductive material 570 into the trenches, conductive vias, and dummy vias in one or several steps. The conductive material may substantially fill the trenches, conductive vias, and dummy vias formed in the low-k dielectric layer 530 and the dielectric layer 540. The conductive materials filled therein may comprise multiple layers such as a liner layer, metal layer, and an ARC layer in one example. The liner layer may function as diffusion barrier and adhesion enhancing layer. The liner layer may comprise titanium, titanium nitride, tantalum, tantalum nitride, combinations thereof, and/or other suitable materials. The liner layer may be formed by CVD and/or PVD. Then a metal material may be filled in by CVD, PVD, plating, and/or other suitable methods. The metal may comprise aluminum, copper, tungsten, polysilicon, metal silicide, or combinations thereof. For example, a copper alloy may be utilized and formed by first sputtering to form a copper seed layer and then plating to substantially fill the trenches, conductive vias, and dummy vias. An ARC layer may be further formed over the copper layer with a method known in the art.

Figure 11:
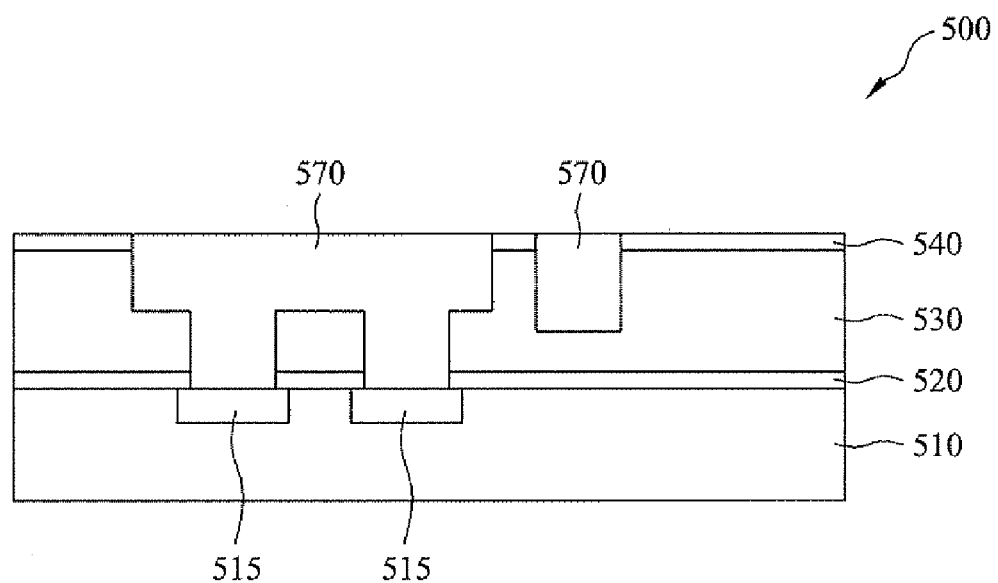

Referring to FIGS. 4 and 11, the method 400 proceeds to step 420 by etching back the excess of the conductive material disposed above the dielectric layer 540 and planarizing. The etching and planarizing techniques may include thermal flow, sacrificial resist etchback, and chemical mechanical polishing (CMP). As one embodiment to planarize, CMP can provide global planarization over different materials such as dielectric and metal. The combination of mechanical effects and chemical reactions results in material removal from the surface of the wafer. Since dummy vias 534 are disposed such that the leveling effect is minimized, top surfaces of the dummy vias 534 and top surfaces of the conductive vias 532 are substantially coplanar after the etching and planarizing processing.

Figure 12:
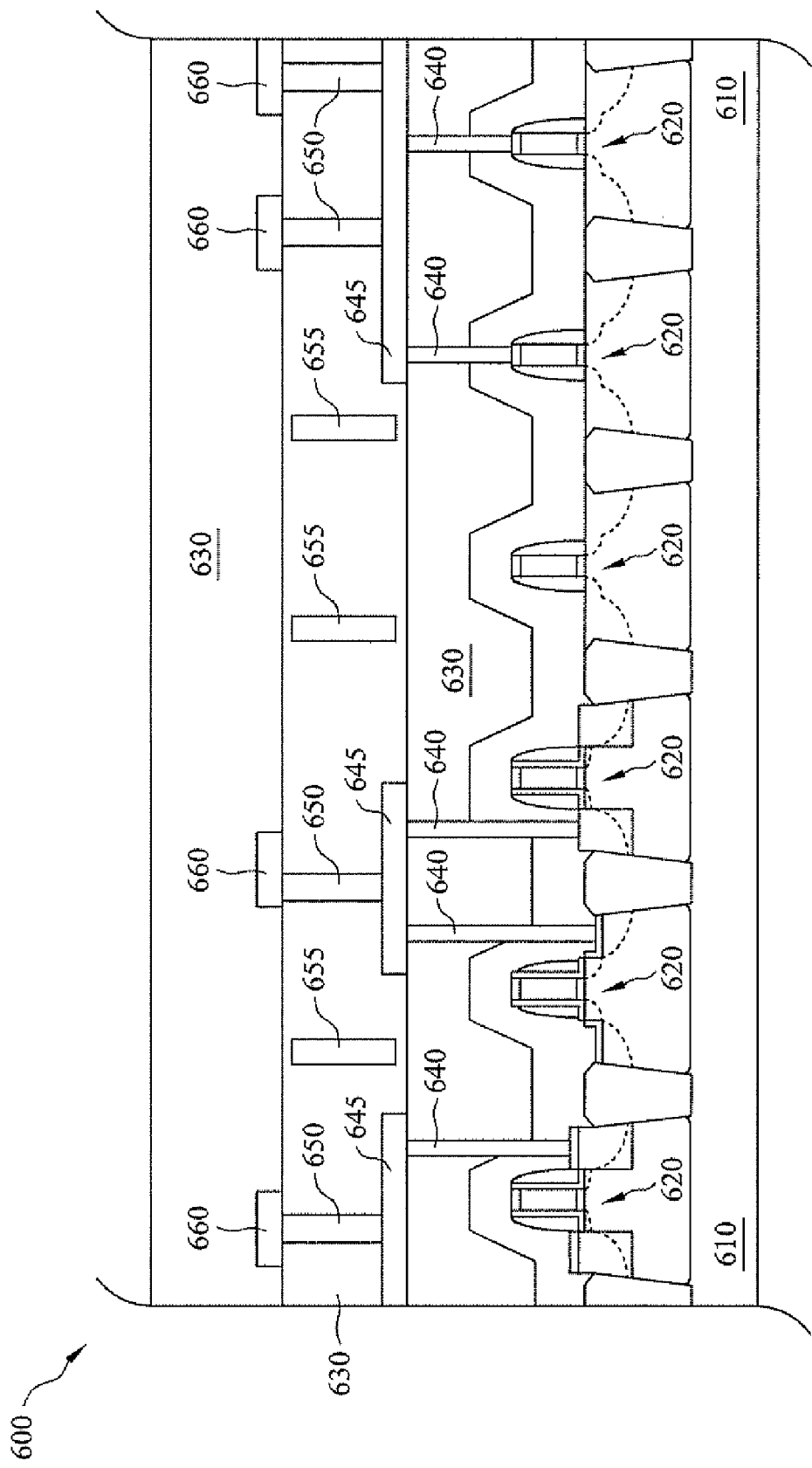
FIG. 12 is a cross-sectional view of one embodiment of an integrated circuit having dummy vias constructed according to aspects of the present disclosure.

Referring to FIG. 12, an integrated circuit device 600 is an environment in which various embodiments of the semiconductor device 100 and/or 500 may be implemented. For example, the integrated circuit device 600 includes a semiconductor substrate 610 and various semiconductor devices 620. The semiconductor devices 620 may comprise a logic circuit, memory cells, or other transistor arrays, including a one-, two- or three-dimensional array, oriented in one or more rows and/or one or more columns.

The integrated circuit device 600 also includes interconnects extending along and/or through one or more dielectric layers 630. The interconnects may comprise contacts 640, metal one lines 645, conductive vias 650, metal two lines 660, and more metal levels comprising vias and lines similar to metal lines 645/660 and conductive vias 650. The interconnect may comprise copper, tungsten, titanium, titanium nitride, gold, aluminum, alloy thereof, carbon nano-tubes, and/or other suitable materials, and may be formed by CVD, PVD, plating and/or other processes. The interconnects may have a homogenous or heterogeneous structure. For example, each metal layer may comprise an adhesion layer possibly comprising titanium, titanium nitride, tantalum or tantalum nitride, a barrier layer possibly comprising titanium nitride or tantalum nitride, and a bulk conductive layer comprising copper, tungsten, aluminum, or aluminum alloy. The interconnect may further include dummy vias 655, wherein each dummy via feature is inserted into inter-level dielectric 630 according to the disclosed method, and may not be electrically connected to underlying and/or overlying conductive lines. The dummy vias 655 may use the same materials and be formed by the same process as the rest of the interconnect. The dummy vias 655 can be formed in other metal levels in the similar way in terms of formation, composition, and configuration.

Thus, the present disclosure provides a method of making integrated circuit having dummy vias. The method comprises providing a low-k dielectric layer on a substrate and a plurality of conductive features disposed in the low-k dielectric layer and first patterning the low-k dielectric layer to form trenches. A second patterning is then performed on the low-k dielectric layer to form conducting vias and dummy vias, wherein each of the conducting vias is aligned with one of the plurality of the conductive features and one of the trenches, and each of the dummy vias is a distance above the plurality of conductive features. The trenches, vias, and dummy vias are filled using a conductive material and planarized.

In this method, the filling may comprise utilizing a method selected from the group consisting of plating, physical vapor deposition, chemical vapor deposition, and combination thereof. The conductive material may be selected from the group consisting of copper, copper alloy, titanium, titanium nitride, tantalum, tantalum nitride, tungsten, polysilicon, metal silicide, and combinations thereof. The substrate may comprise a hard mask layer disposed over the low-k dielectric layer. The hard mask layer may be tuned to function as an anti-reflective coating (ARC) layer. The hard mask layer may comprise a material selected from the group consisting of silicon nitride, silicon oxynitride, silicon carbide, tantalum nitride, titanium nitride, and combination thereof. The method may further comprise patterning the hard mask layer before the first patterning and the second patterning. The substrate may comprise an etch stop layer disposed between the conductive features and the low-k dielectric layer. The first and second patterning may comprise utilizing a lithography process and an etching process.

Another method for making an integrated circuit includes providing an etch stop layer on a substrate having conductive features, forming a low-k dielectric layer on the etch stop layer, forming a hard mask layer on the low-k dielectric layer, and forming trenches, conductive vias, and dummy vias. Each of the conductive vias is configured for connecting one of the trenches and one of the conductive features while each of the dummy vias is isolated. The trenches, conductive vias, and dummy vias are filled using a conductive material; and planarized using chemical mechanic polishing (CMP).

In the disclosed methods, the trenches, vias, dummy vias may be formed utilizing a via-first method or a trench-first method. The trenches, conductive vias, and dummy vias may utilize an etch method selected from the group consisting of a partial via etch, a full via etch, a selective etch, and combination thereof. The dummy vias may be shaped, sized, and positioned to compensate the vias such that a leveling effect is minimized.

The present disclosure also provide a semiconductor device. The device comprises a first plurality of conductive lines formed in a low-k dielectric layer on a substrate, a second plurality of conductive lines formed in the low-k dielectric layer and disposed over the first plurality of conductive lines, and a first plurality of conductive vias disposed between the first and second plurality of conductive lines. Each conductive via is connected to one of the first plurality of conductive lines and one of the second plurality of conductive lines. The device further includes a second plurality of vias disposed between and isolated from the first and second plurality of conductive lines, wherein top surfaces of the second plurality of conductive lines and top surfaces of the second plurality of conductive vias are substantially coplanar.

In the disclosed device, the second plurality of conductive vias may have shapes selected from the group consisting of a square, a rectangle, a rectangular array, a broken stripe, a dotted stripe, a circle, a triangle, polygon, and a cross. The second plurality of conductive vias may have via size not less than about 0.8*minimum via size of the first plurality of conductive vias. The second plurality of conductive vias may be positioned such that a leveling effect is minimized. The second plurality of conductive vias may be positioned such that the total density of the first and second plurality of conductive vias are uniformly distributed. The second plurality of conductive vias may comprise a material selected from the group consisting of copper, tungsten, titanium, titanium nitride, tantalum, tantalum nitride, and combinations thereof. The semiconductor device may further comprise an etch-stop layer disposed at an interface between the first plurality of conductive lines and the first plurality of conductive vias.

The foregoing has outlined features of several embodiments so that those skilled in the art may better understand the detailed description that follows. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions and alterations herein without departing from the spirit and scope of the present disclosure.

What is claimed is:

1. A method of making an integrated circuit, comprising:
    providing a low-k dielectric layer on a substrate, the low-k dielectric layer including or adjacent to a plurality of conductive features;
    patterning the low-k dielectric layer to form trenches;
    patterning the low-k dielectric layer to form conductive vias and dummy vias, wherein each of the conductive vias is aligned with at least one of the plurality of the conductive features and at least one of the trenches, and each of the dummy vias extends partially through the low-k dielectric layer to a distance above the plurality of conductive features;
    filling the trenches, conductive vias, and dummy vias using one or more conductive materials; and
    planarizing the conductive material(s).

2. The method of claim 1 wherein filling comprises utilizing a method selected from a group consisting of plating, physical vapor deposition, chemical vapor deposition, and combinations thereof.

3. The method of claim 1 wherein the conductive materials are selected from a group consisting of copper, copper alloy, titanium, titanium nitride, tantalum, tantalum nitride, tungsten, polysilicon, metal silicide, and combinations thereof.

4. The method of claim 1 wherein the substrate comprises a hard mask layer disposed over the low-k dielectric layer.

5. The method of claim 4 wherein the hard mask layer is tuned to function as an anti-reflective coating (ARC) layer.

6. The method of claim 4 wherein the hard mask layer comprises a material selected from a group consisting of silicon nitride, silicon oxynitride, silicon carbide, tantalum nitride, titanium nitride, and combinations thereof.

7. The method of claim 6 further comprising patterning the hard mask layer before patterning the low-k dielectric material.

8. The method of claim 1 wherein the substrate comprises an etch stop layer disposed between the conductive features and the low-k dielectric layer.

9. The method of claim 8 wherein the patterning comprises utilizing a lithography process and an etching process.

10. A method of making an integrated circuit, comprising:
    providing an etch stop layer on a substrate having conductive features;
    forming a low-k dielectric layer on the etch stop layer;
    forming a hard mask layer on the low-k dielectric layer;
    forming trenches, conductive vias, and dummy vias, wherein each of the conductive vias is configured for connecting one of the trenches and one of the conductive features while each of the dummy vias is isolated from the trenches and the conductive features;
    filling the trenches, conductive vias, and dummy vias using a conductive material; and
    planarizing the conductive material.

11. The method of claim 10 wherein the forming trenches, conductive vias, dummy vias comprises utilizing a via-first method or a trench-first method.

12. The method of claim 10 wherein the forming trenches, conductive vias, dummy vias comprises utilizing an etch method selected from the group consisting of a partial via etch, a full via etch, a selective etch, and combinations thereof.

13. The method of claim 10 wherein the dummy vias are shaped, sized, and positioned to compensate the vias such that a leveling effect is minimized.

14. A method of making an integrated circuit, comprising:
    providing a semiconductor layer including a plurality of conductive features;
    providing a low-k dielectric layer on the semiconductor layer;
    patterning the low-k dielectric layer to form trenches;
    patterning the low-k dielectric layer to form conductive vias and dummy vias, wherein the conductive vias and dummy vias extend varying distances into the low-k dielectric layer, the conductive vias extending from at least one of the trenches through the low-k dielectric layer to the semiconductor layer including the plurality of conductive features, and the dummy vias extending through the low-k dielectric to a distance above the semiconductor layer including the plurality of conductive features; and
    filling the trenches, conductive vias, and dummy vias using one or more conductive materials; and
    planarizing the one or more conductive materials.

* * * * *